(12) United States Patent
Sasaki

(10) Patent No.: US 8,218,392 B2
(45) Date of Patent: Jul. 10, 2012

(54) WORD LINE DRIVING APPARATUS

(75) Inventor: Toshirou Sasaki, Miyazaki (JP)

(73) Assignee: Lapis Semiconductor Co., Ltd. (JP)

( * ) Notice: Subject to any disclaimer, the term of this patent is extended or adjusted under 35 U.S.C. 154(b) by 109 days.

(21) Appl. No.: 12/847,447

(22) Filed: Jul. 30, 2010

(65) Prior Publication Data

US 2011/0044122 A1 Feb. 24, 2011

(30) Foreign Application Priority Data

Aug. 19, 2009 (JP) ................................. 2009-190000

(51) Int. Cl.
*G11C 8/08* (2006.01)
(52) U.S. Cl. ............................. 365/230.06; 365/189.11
(58) Field of Classification Search ............. 365/185.23, 365/230.06, 189.11, 193
See application file for complete search history.

(56) References Cited

U.S. PATENT DOCUMENTS

| 3,898,480 | A | * | 8/1975 | Spence et al. ................... 377/75 |
| 4,503,343 | A | * | 3/1985 | Ohuchi ........................... 326/88 |
| 5,335,205 | A | * | 8/1994 | Ogihara .................... 365/230.06 |
| 5,748,533 | A | * | 5/1998 | Dunlap et al. ........... 365/185.19 |
| 6,292,163 | B1 | * | 9/2001 | Nam et al. ..................... 345/100 |
| 7,053,693 | B2 | * | 5/2006 | Toyoda et al. ................ 327/536 |
| 2003/0043131 | A1 | * | 3/2003 | Iguchi ........................... 345/204 |
| 2004/0052146 | A1 | * | 3/2004 | Sim .......................... 365/230.03 |

FOREIGN PATENT DOCUMENTS

JP  11-039865  2/1999

* cited by examiner

*Primary Examiner* — Douglas King
(74) *Attorney, Agent, or Firm* — Studebaker & Brackett PC; Donald R. Studebaker

(57) ABSTRACT

A source potential of a pull-up transistor is increased after predetermined time from a rising timing of a word line selection command signal. To this end, a condenser is provided to couple the source potential and gate potential of the pull-up transistor. Preferably a gate potential control transistor that controls the gate potential of the pull-up transistor is a depletion type N-channel field effect transistor that maintains the gate potential at a low level.

10 Claims, 5 Drawing Sheets

WORD LINE DRIVING APPARATUS

BACKGROUND OF THE INVENTION

1. Field of the Invention

The present invention relates to an apparatus that drives a word line connected to a memory cell array.

2. Description of the Related Art

A memory cell array is often used as a memory device. One such memory device is a semiconductor storage media in the form of DRAM. A word line driving apparatus that drives a word line of such memory cell array has been known in the art (for example, Japanese Patent Application Kokai No. 11-39865). The word line driving apparatus selects and drives a particular word line connected to a particular memory cell in the memory cell array so that desired data be written in and/or read from the designated memory cell. Generally, in order to certainly perform the writing and reading, a boosted voltage derived from a power supply voltage is supplied from the word line driving apparatus to the word line concerned.

SUMMARY OF THE INVENTION

Recently, a low voltage operation has been demanded in order to reduce power consumption of the apparatus. FIG. 6 of the accompanying drawings explains a principle of a word line driving circuit disclosed in Japanese Patent Application Kokai No. 11-39865. In this word line driving circuit, when voltage that is supplied, for example, from a control circuit 203 to a gate of a transistor 202 is reduced to a threshold voltage of the transistor 202, a gate voltage of a pull-up transistor 200 drops and the pull-up transistor 200 is not turned on. As a result, only voltage that is lower than the boosted voltage Vpp is supplied to the word line. Consequently, the writing in and reading from the associated memory cell cannot be performed appropriately.

One object of the present invention is to provide a word line driving apparatus that can operate with a reduced voltage but that can still supply sufficient voltage to a designated word line for selection of a desired one memory cell in a memory cell array.

According to one aspect of the present invention, there is provided a word line driving apparatus that includes a controller that generates a selection command signal commanding selection of a certain word line. The driving apparatus also includes a pull-down transistor that is turned on according to gate potential of the pull-down transistor when the selection command signal is absent. The pull-down transistor then reduces potential of the word line to a word line non-selection level by source potential of the pull-down transistor. The driving apparatus also includes a pull-up transistor that is turned on according to gate potential of the pull-up transistor and increases the potential of the word line to the word line selection level by the source potential of the pull-up transistor. The driving apparatus also includes a gate potential control transistor that controls the gate potential of the pull-up transistor according to existence and absence of the selection command signal. The driving apparatus also includes a condenser (capacitor) that couples the source potential of the pull-up transistor with the gate potential of the pull-up transistor. The controller increases the source potential of the pull-up transistor after predetermined time elapses from rising of each selection command signal.

The word line driving apparatus can reduce the power supply voltage but still can supply a sufficient voltage to the word line for selection of the memory cell.

The gate potential control transistor may be a depletion type N channel field effect transistor. The gate potential of the gate potential control transistor may always be maintained at a low level. The controller may further include a gate potential switching unit that makes the gate potential of the potential control transistor high in a predetermined period from rising timing of the selection command signal.

These and other objects, aspects and advantages of the present invention will become apparent to those skilled in the art from the following detailed description of the invention when read and understood in conjunction with the appended claims and drawings.

DETAILED DESCRIPTION OF THE INVENTION

Hereinafter, exemplary embodiments according to the present invention will be described with reference to the accompanying drawings.

First Embodiment

Figure 1:
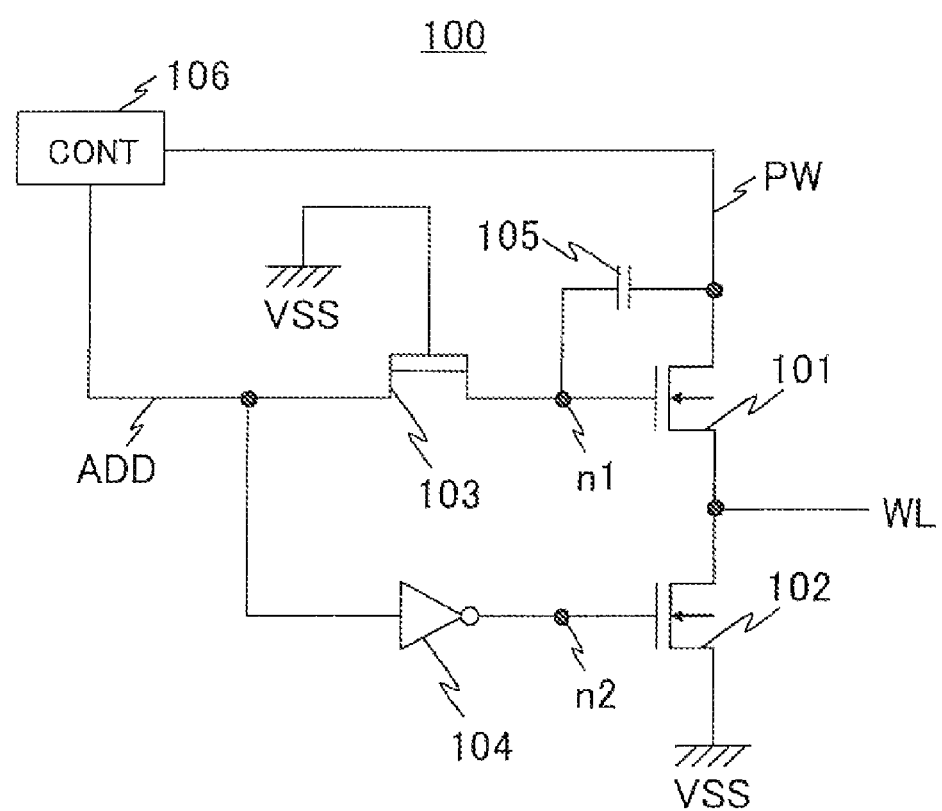
FIG. 1 is a circuit diagram showing a word line driving apparatus according to a first embodiment of the present invention.

Referring to FIG. 1, a word line driving apparatus 100 according to a first embodiment will be described. The word line driving apparatus 100 is a word line driver circuit that drives one of a plurality of word lines connected to a particular memory cell in a memory cell array. The memory cell array constitutes a memory such as DRAM. One word line driving apparatus 100 is provided for one word line. Generally, the word line driving apparatus 100 is configured in the form of a circuit and provided in an LSI (not shown).

The word line driving apparatus 100 includes a pull-up transistor 101, a pull-down transistor 102, a gate potential control transistor 103, an inverter 104, a condenser 105, and a controller 106.

The pull-up transistor 101 is adapted to increase potential of the word line (not shown) to a word line selection level when that word line is selected. The pull-down transistor 102 reduces the potential of the word line to a word line non-selection level when the word line is not selected. In this embodiment, the pull-up transistor 101 is an N-channel field effect transistor such as NMOS, and the pull-down transistor 102 is also an N-channel field effect transistor such as NMOS.

A power signal PW (hereinafter, referred to as simply signal PW) from the controller 106 is introduced to the source of the pull-up transistor 101. When a word line is selected, a signal having a signal level approximately same as the signal level of the signal PW is supplied to that word line. The gate of the pull-up transistor 101 is connected to the drain of the gate potential control transistor 103 at a node n1. When the word line is selected, the pull-up transistor 101 is turned on or turned off in accordance with the potential at the node n1. The drain of the pull-up transistor 101 is connected to the word line (not shown). When the word line is selected, a word line signal WL (hereinafter, referred to as simply signal WL) having a signal level approximately the same as the signal level of the signal PW is supplied to the word line from the drain of the pull-up transistor 101.

The source of the pull-down transistor 102 is connected to a ground potential VSS. When the word line is not selected, the signal WL having potential approximately the same as the ground potential VSS is supplied to the word line. The gate of the pull-down transistor 102 is connected to the output of the inverter 104 at a node n2. When the word line is not selected, the pull-up transistor 101 is turned on by the potential of the node n2. The drain of the pull-down transistor 102 is connected to the drain of the pull-up transistor 101 and is also connected to the word line (not shown). When the word line is not selected, the signal WL having potential approximately the same as the ground potential VSS is supplied to the word line.

The gate potential control transistor 103 is configured to control the gate potential (potential at the node n1) of the pull-up transistor 101. The gate potential control transistor 103 is a so-called N-channel field effect transistor of a depression type. The gate of the gate potential control transistor 103 is connected to the ground potential. The source of the gate control potential transistor 103 is given the word line selection control signal ADD (hereinafter, referred to as simply signal ADD) from the controller 106. The signal ADD is a signal issued from the controller 106 to select or not to select the word line. The drain of the gate potential control transistor 103 is connected to the gate (node n1) of the pull-up transistor 101.

The signal ADD from the controller 106 is also introduced to the input of the inverter 104. The output of the inverter 104 is connected to the gate (node n2) of the pull-down transistor 102. Therefore, the inverter 104 provides the inverted level of the signal ADD to the node n2. Accordingly, when any one of the pull-up transistor 101 and the pull-down transistor 102 is in a turned-on state, the other is in a turned-off state.

The capacitor 105 is connected between the source and gate of the pull-up transistor 101 and makes coupling between the potential of the source and the potential of the gate. The capacitor 105 is charged according to the potential (potential of the node n1) of the gate of the pull-up transistor 101 that is controlled by the gate potential control transistor 103. The capacitor 105 uses parasitic capacity between the source and the gate. Alternatively, the capacitor 105 may be provided in the form of independent element. The capacity value of the capacitor 105 is, for example, 500 pF, but a different value may be used depending upon given conditions.

The controller 106 is a so-called word line decoder circuit that controls the signal ADD and the signal PW. The controller 106 can be a control circuit that is constituted by a microprocessor such as CPU. One word line driving apparatus 100 may include one controller 106, or a plurality of word line driving apparatuses 100 may share a single controller 106.

The controller 106 generates the word line selection control signal (i.e., signal ADD) for selecting or no-selecting the word line and supplies the signal ADD to the source of the gate potential control transistor 103 and to the input of the inverter 104. In this embodiment, the signal ADD when the signal level is a high level (VDD) is referred to as a selection command signal that commands the selection of the word line and the signal ADD when the signal level is a low level (VSS) is referred to as a non-selection command signal that commands the no selection of the word line. Thus, the controller 106 generates and outputs the selection command signal or the non-selection command signal.

In addition, the controller 106 supplies the signal PW, that defines the signal level supplied to the word line, to the source of the pull-up transistor 101. The controller 106 has a voltage generation apparatus (not shown) therein to generate the signal ADD or the signal PW of the low level (ground potential VSS), the high level (power supply potential VDD), and the boosted level (VDD+α) on the basis of the selection/no-selection of the word line. Alternatively, the controller 106 may be connected to a separate voltage generation apparatus (not shown) to receive the low level (ground potential VSS), the high level (power supply potential VDD), and the boosted level (VDD+α) therefrom on the basis of the selection/no-selection of the word line and generate the signal ADD and/or PW.

Figure 2:
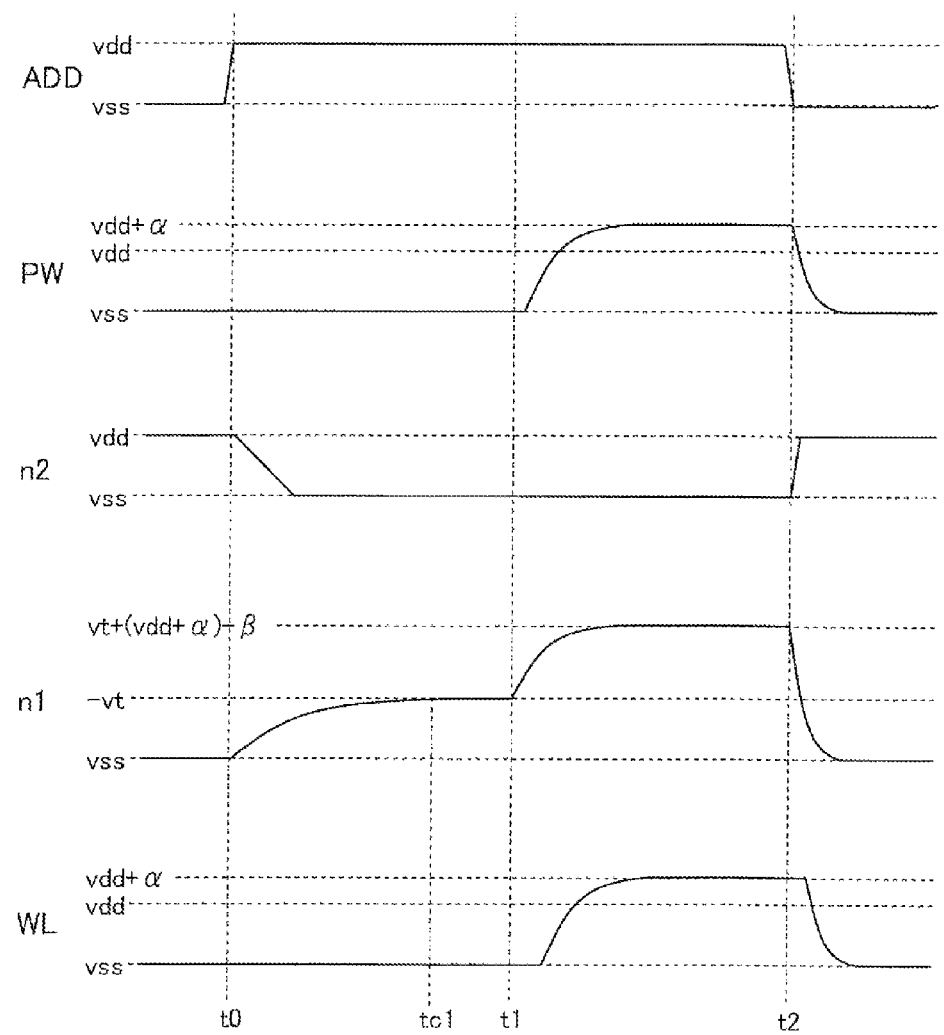
FIG. 2 shows various operational waveforms of the word line driving apparatus shown in FIG. 1.

FIG. 2 is a set of operational waveforms of the word line driving apparatus 100. A horizontal axis of each diagram shows time and a vertical axis shows the signal level of a respective signal (signal ADD, signal PW, the node n1, the node n2, and the signal WL). Hereinafter, the operation of the word line driving apparatus 100 will be described with reference to FIG. 2.

A period up to time t0 is the word line non-selection period. During the period, the controller 106 generates and outputs the signal ADD at the low level (ground potential VSS), that is, it issues the non-selection command signal. The controller 106 also generates and outputs the signal PW at the VSS level.

Figure 3:
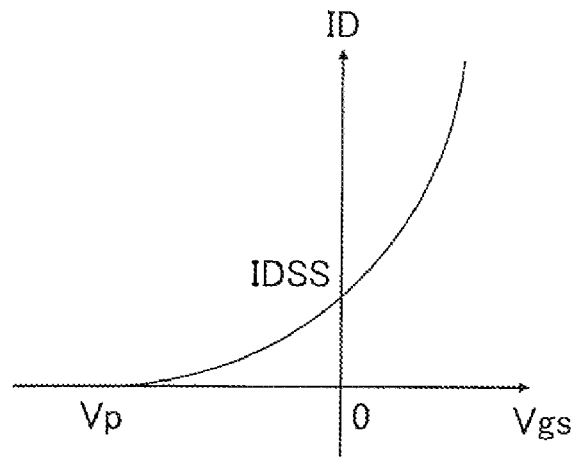
FIG. 3 shows one example of ID-VGS characteristics of a depletion type N-channel field effect transistor.

The gate potential control transistor 103 is the depletion type N-channel field effect transistor. Since VSS is supplied to the gate of the potential control transistor 103, the gate potential control transistor 103 is in a turned-on state. FIG. 3 is a diagram showing one example of ID-VGS characteristics of a depletion type N-channel field effect transistor. Even when the gate-source voltage VGS is 0V, the gate potential control transistor 103 is in a turned-on state so that drain current ID flows. In other words, if the gate of the gate potential control transistor 103 is supplied with ground potential VSS or potential which is equal to or less than threshold voltage Vtd, the gate potential control transistor 103 is in a turned-on state. Thus, application of high voltage to the gate of the gate potential control transistor 103 is not needed.

Since the gate potential control transistor 103 is in a turned-on state, the voltage at the node n1 is VSS. Because the node n1 voltage is VSS, the pull-up transistor 101 is in a turned-off state. Since the signal level of the signal ADD is inverted by the inverter 104, the node n2 is at a high level (power supply potential VDD; hereinafter, referred to as simply VDD). Since the node n2 voltage is VDD, the pull-down transistor 102 is in a turned-on state. Therefore, the potential of the word line is reduced to the word line non-selection level (VSS) by the pull-down transistor 102.

A period from time t0 to time t2 is the word line selection period. The controller 106 switches the signal level of the signal ADD from VSS to VDD at time t0 and outputs the signal ADD. In other words, the controller 106 generates and outputs the selection command signal. The node n2 is supplied with VSS that is an inverted level of the signal ADD. Thus, the pull-down transistor 102 is brought into a turned-off state. On the other hand, the node n1 is supplied with the signal ADD via the gate potential control transistor 103. Since the condenser 105 is slowly or gradually charged over a period from time t0 to time tc1, the signal level of the node n1 is increased from VSS to a predetermined voltage.

More specifically, the signal level of the node n1 is increased to the potential that is obtained by subtracting the threshold voltage Vtd from the gate potential of the gate potential control transistor 103. When the gate potential is VSS (=0V), it is increased to −Vtd. For example, if the threshold voltage Vtd is −0.7V, it is increased to 0.7V (0V−(−0.7V)= 0.7V). The gate potential control transistor 103 becomes a turned-off state at time (time tc1) when the signal level of the node n1 is increased to −Vtd (for example, 0.7V) because of the characteristics of the depletion type n-channel field effect transistor.

The controller 106 increases the signal level of the signal PW from VSS to VDD+α after a predetermined time (time t1) from the rising timing (time t0) of the selection command signal. Time t1 comes after time tc1. The voltage increase timing is previously set in the controller 106 so that time t1 follows time tc1 in consideration of the capacitance of the condenser 105 and other factors. VDD+α is voltage that is necessary to read/write data from/into the memory cell (not shown) connected to the word line. α may be appropriately decided depending upon given conditions.

The change in the signal level of the signal PW is reflected to the potential of the node n1 by the coupling effect of the condenser 105 after time t1. Specifically, the potential of the node n1 is increased from −Vtd to −Vtd+(VDD+α)−β. β is voltage that drops due to a loss in the boosting. For example, when VDD is 0.7V, Vtd is −0.7V, α is 2V, and β is 0.1V, then VDD+α=2.7V and −Vtd+(VDD+α)−β=3.3V.

The gate potential (node n1) based on the source potential (VDD+α=2.7V) of the pull-up transistor 101 is 0.6V (3.3V−2.7V=0.6V). When the threshold voltage Vtn of the pull-up transistor 101 is, for example, 0.5V, the potential (0.6V) of the node n1 is greater than Vtn (0.5V). Thus the pull-up transistor 101 is in a turned-on state. Because the gate potential control transistor 103 is in a turned-off state, the potential of the node n1 is not influenced by the signal ADD. It should be noted that the values of the above-mentioned signal levels are mere examples, and different values may be used depending upon given conditions.

Since the pull-up transistor 101 is turned-on, the potential of the word line is increased to the word line selection level (i.e., the signal level VDD+α) of the signal PW by the pull-up transistor 101. Thus, the voltage VDD+α necessary to turn on the memory cell is supplied to the word line without loss. Accordingly, the reading and writing of data of the memory cell can be performed in a reliable manner.

A period after time t2 is the word line non-selection period. The controller 106 switches the signal level of the signal ADD and the signal level of the signal PW, respectively, from VDD to VSS at time t2 and outputs the signals ADD and PW. In other words, the controller 106 generates and outputs the non-selection command signal. The condenser 105 is discharged after the signal PW becomes VSS. After the signal ADD having the value VSS is supplied to the node n1 via the gate potential control transistor 103, the node n1 is reduced to VSS. Since the inverted level VDD of the signal ADD is supplied to the node n2, the pull-down transistor 102 becomes a turned-on state. The potential of the word line is reduced to the word line non-selection level (VSS) by the pull-down transistor 102.

According to the word line driving apparatus of the first embodiment, voltage enough to turn on the memory cell can be supplied to the word line by supplying the boosted potential to the source of the pull-up transistor after the gate potential of the pull-up transistor is increased by charging the condenser. In addition, by using the depletion type N-channel field effect transistor as the transistor (gate potential control transistor) to control the gate potential of the pull-up transistor, the voltage supplied to the gate of the pull-up transistor can be low voltage such as the ground potential (VSS). In other words, it is not necessary to supply high voltage to the gate of the gate potential control transistor. If the gate of the gate potential control transistor is supplied with voltage similar to the threshold voltage (Vtd) or less voltage such as ground potential, the gate potential control transistor is brought into a turned-on state. Since the power supply voltage can be reduced to a low voltage similar to the threshold voltage or to the ground potential, the power consumption can be reduced.

According to the word line driving apparatus of the first embodiment, the power supply voltage is a reduced or lower voltage on one hand, and voltage enough to select the memory cell can be supplied to the word line on the other hand.

Second Embodiment

Figure 4:
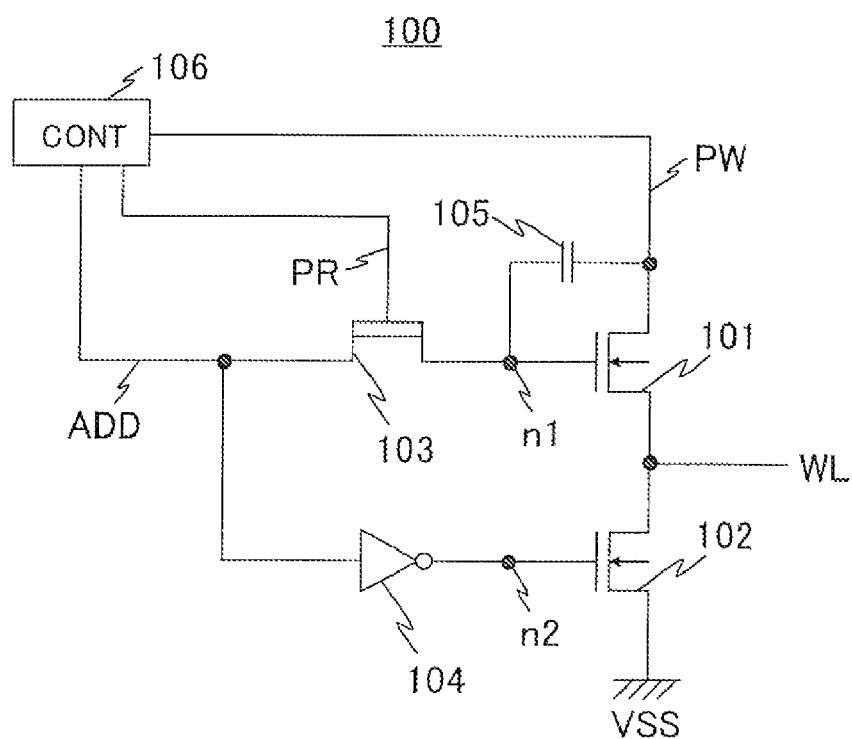
FIG. 4 is a circuit diagram showing a word line driving apparatus according to a second embodiment of the present invention.

FIG. 4 is a circuit diagram showing the word line driving apparatus 100 according to a second embodiment. In the following description, different components from the first embodiment will be mainly described. The second embodiment is different from the first embodiment in that a charging control signal PR (hereinafter, referred to as simply PR) is supplied from the controller 106 to the gate of the gate potential control transistor 103.

Figure 5:
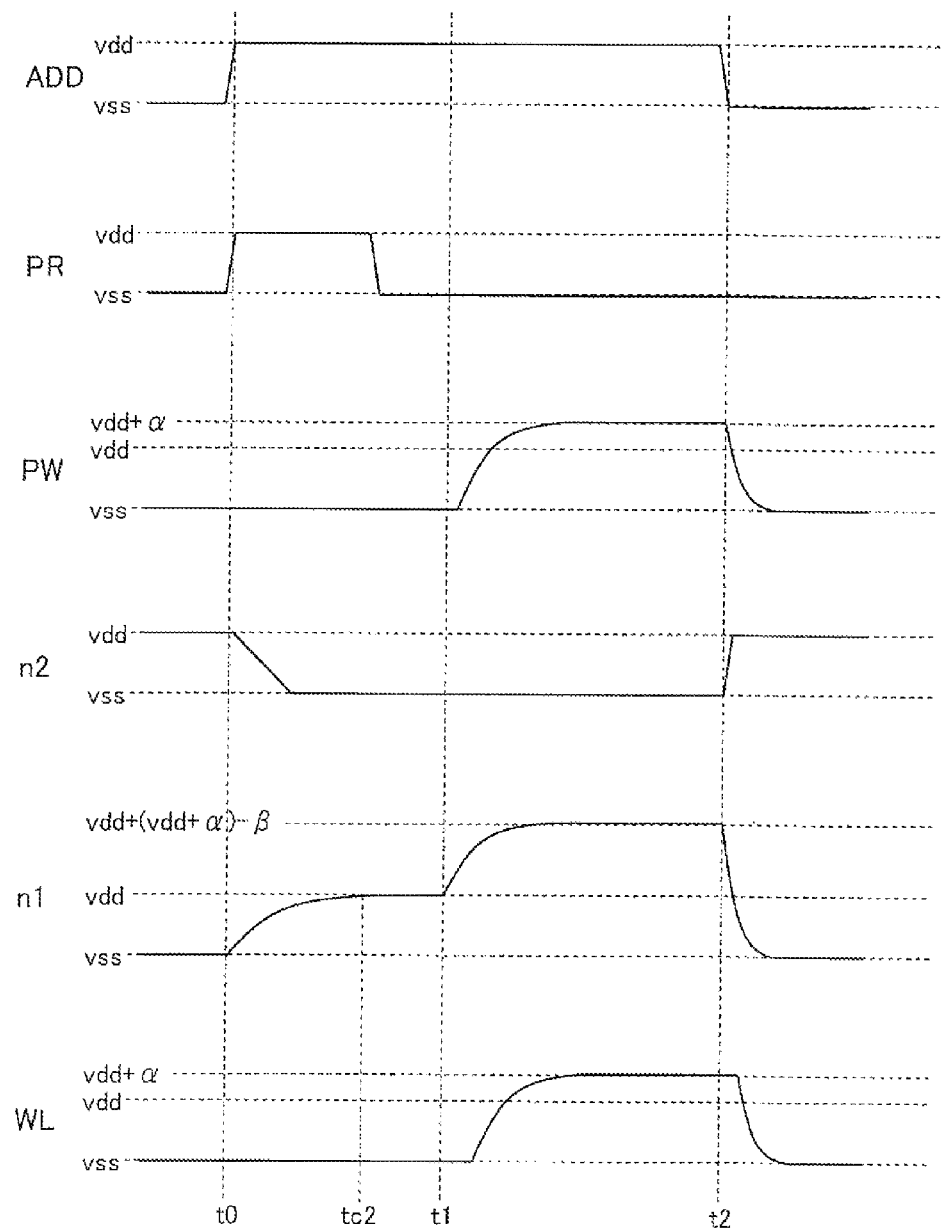
FIG. 5 shows various operational waveforms of the word line driving apparatus shown in FIG. 4.
Figure 6:
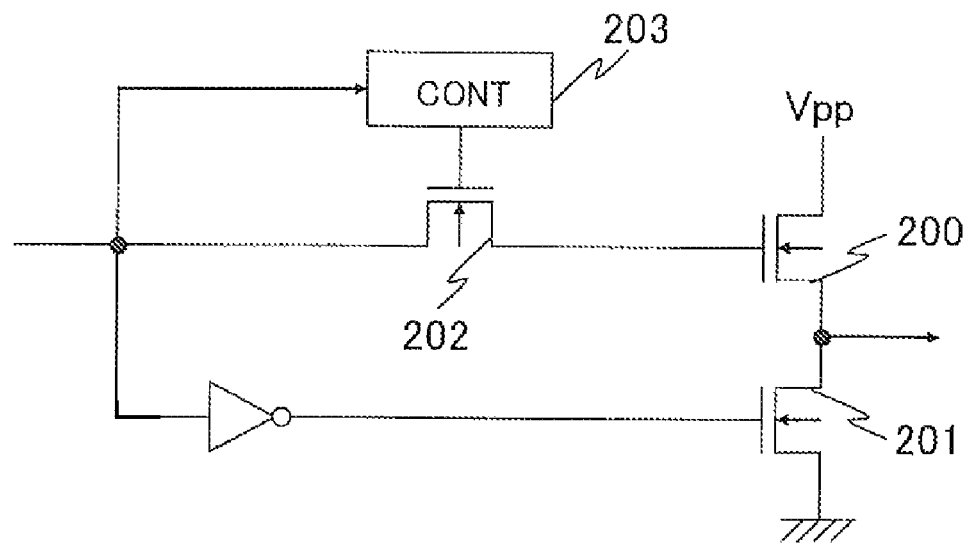
FIG. 6 illustrates a principle of a word line driving circuit according to the prior art.

FIG. 5 is a set of diagrams showing the operational waveform of the word line driving apparatus 100 according to the second embodiment. The horizontal axis of each diagram represents time and the vertical axis represents the signal level of the respective signal (the signal ADD, the signal PR, the signal PW, the node n1, the node n2, and the signal WL), respectively. Hereinafter, the operation of the word line driving apparatus 100 will be described with reference to FIG. 5.

A period up to t0 is the word line non-selection period. During the period, the controller 106 outputs the signal ADD, the signal PW, and the signal PR at the signal level VSS, respectively. In other words, the controller 106 generates the non-selection command signal. During the word line non-selection period, the gate potential control transistor 103 that is the depletion type N-channel field effect transistor is in a turned-on state. Since the node n1 is at the voltage VSS, the pull-up transistor 101 is in a turned-off state. Since the node n2 voltage is VDD, the pull-down transistor 102 is in a turned-on state. Therefore, the potential of the word line is reduced to the word line non-selection level (VSS) by the pull-down transistor 102.

A period from time t0 to time t2 is the word line selection period. The controller 106 switches the signal levels of the signal ADD and the signal PW, respectively, from the VSS to the VDD at time t0 and outputs these signals ADD and PW. In other words, the controller 106 generates and outputs the selection command signal. Since the signal level of the node n2 is VSS, the pull-down transistor 102 is in a turned-off state.

Although the gate potential control transistor 103 whose gate is applied with the signal ADD having the signal level VDD continues to be in a turned-on state, larger drain current flows as compared to the case where the ground potential VSS is applied. Since the condenser 105 is slowly or gradually charged over a period from time t0 to time tc2, the signal level of the node n1 is increased to VDD due to the characteristics of the depletion type N-channel field effect transistor. Since the relatively larger drain current flows into the gate potential control transistor 103, the capacitor 105 is charged in a relative short period. As a result, the charging period from time t0 to time tc2 in the second embodiment is shorter than the charging period from time t0 to time tc1 in the first embodiment. The pull-up transistor 101 is in a turned-off state at the time (time tc2) when the signal level of the node n1 is increased to the value VDD.

The controller 106 switches the signal level of the signal PR from VDD to VSS after a predetermined time elapses from time t0 and outputs the signal PR. In other words, the controller 106 maintains the gate potential of the gate potential control transistor 103 at a high level (VDD) in the period from the rising timing of the selection command signal, that is, the starting time (time t0) of the word line selection period to the time tc2 when the predetermined time elapses. The voltage increase timing from time t0 is previously set in the controller 106 in consideration of the capacitance value of the condenser 105 and other factors. The voltage increase timing is generally set to (or around) the time tc2 when the charging of the condenser 105 completes.

The controller 106 increases the signal level of the signal PW from the VSS to the VDD+α after the predetermined time (time t1) from the rising timing (time t0) of the selection command signal. Time t1 is a time after time tc2. The voltage increase timing from time t0 is previously set in the controller 106 so that time t2 follows time tc1 in consideration of characteristics, such as the capacitance value, of the condenser 105. Since the charging period of the condenser 105 is relatively short, the signal level of the signal PW can be switched to VDD+α at an earlier timing.

After the time t1, the potential of the node n1 is increased from VDD to (VDD+α)−β by the coupling effect of the condenser 105. For example, when VDD is 0.7V, α is 2V, and β is 0.1V, then VDD+α=2.7V and VDD+(VDD+α)−β=3.3 V. The gate potential (node n1) based on the source potential (VDD+α=2.7V) of the pull-up transistor 101 is 0.6V (3.3V−2.7V=0.6V). When the threshold voltage Vtn of the pull-up transistor 101 is, for example, 0.5V, the potential (0.6V) of the node n1 is greater than Vtn (0.5V). Thus, the pull-up transistor 101 is in a turned-on state. The gate potential control transistor 103 is in a turned-off state so that the potential of the node n1 is not influenced by the signal ADD. It should be noted that the values of the above-mentioned signal levels are mere examples and other suitable values may be used.

Since the pull-up transistor 101 is turned on, the potential of the word line can be increased to the word line selection level (the signal level VDD of the signal PW+α) by the pull-up transistor 101. Thus, the voltage VDD+α necessary to turn on the memory cell is supplied to the word line without loss, and therefore the reading and writing of data of the memory cell can be reliably performed. A period after the time t2 is the word line non-selection period, which is the same as the first embodiment.

As described above, the word line driving apparatus of the second embodiment further includes a unit that supplies the signal PW to the gate of the gate potential control transistor and makes the signal level of the signal PW high (VDD) for a predetermined time from the starting time of the word line selection period. Since larger drain current flows as compared with the case where the ground potential VSS is applied to the gate, the charging of the condenser is completed in a relatively short period. Therefore, the boosted voltage (VDD+α) can be supplied to the word line in a shorter period, and a higher memory operational frequency can be achieved.

As understood from the foregoing, the word line driving apparatus of the second embodiment can operate with a lower-voltage power supply, but can supply the voltage enough to select the memory cell to the word line. Also, the word line driving apparatus can select a word line at high speed, and can increase the memory operation frequency.

This application is based on Japanese Patent Application No. 2009-190000 filed on Aug. 19, 2009 and the entire disclosure thereof is incorporated herein by reference.

What is claimed is:

1. A word line driving apparatus, comprising
a controller that generates a selection command signal commanding selection of a word line;
a pull-down transistor that is turned on by its own gate potential and reduces word line potential to a word line non-selection level by its own source potential while the selection command signal is absent;
a pull-up transistor that is turned on by its own gate potential and increases the word line potential to a word line selection level by its own source potential;
a gate potential control transistor that controls the gate potential of the pull-up transistor according to existence and absence of the selection command signal; and
a condenser that couples the source potential of the pull-up transistor with the gate potential of the pull-up transistor, wherein the controller increases the source potential of the pull-up transistor after a predetermined time from rising timing of the selection command signal.

2. The word line driving apparatus according to claim 1, wherein the gate potential control transistor is a depletion type N channel field effect transistor.

3. The word line driving apparatus according to claim 2, wherein the gate potential of the gate potential control transistor is maintained at a low level.

4. The word line driving apparatus according to claim 1, wherein the controller further includes a gate potential switching unit that makes the gate potential of the potential control transistor high in a predetermined period from rising timing of the selection command signal.

5. The word line driving apparatus according to claim 4, wherein the gate potential control transistor is a depletion type N-channel field effect transistor.

6. The word line driving apparatus according to claim 1, wherein the word line is grounded via the pull-down transistor when the selection command signal is absent.

7. The word line driving apparatus according to claim 1, wherein the pull-up transistor is in a turned-on stated when the selection command signal is absent.

8. The word line driving apparatus according to claim 1, wherein the source of the pull-down transistor is grounded.

9. The word line driving apparatus according to claim 1, wherein the gate of the gate potential control transistor is grounded.

10. The word line driving apparatus according to claim 1, wherein the pull-down transistor is in a turned on state when the pull-up transistor is in a turned off state.

* * * * *